United States Patent
Shin et al.

(10) Patent No.: US 10,852,645 B2
(45) Date of Patent: Dec. 1, 2020

(54) METHOD OF MINIMIZING ERRORS OF OPTICAL PROXIMITY CORRECTION IN SEMICONDUCTOR PATTERN AND DEVICE FOR PERFORMING THE SAME

(71) Applicant: SAMSUNG ELECTRONICS CO., LTD., Suwon-si, Gyeonggi-do (KR)

(72) Inventors: Moo Joon Shin, Hwaseong-si (KR); Kyung Jae Park, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 16/400,526

(22) Filed: May 1, 2019

(65) Prior Publication Data
US 2020/0124980 A1    Apr. 23, 2020

(30) Foreign Application Priority Data

Oct. 17, 2018 (KR) .......................... 10-2018-0123979

(51) Int. Cl.
*G06F 30/00*      (2020.01)
*G03F 7/20*       (2006.01)
*G06F 30/20*      (2020.01)

(52) U.S. Cl.
CPC .......... *G03F 7/70441* (2013.01); *G06F 30/20* (2020.01)

(58) Field of Classification Search
CPC ....................................................... G06F 30/20
USPC ........................................................... 716/53
See application file for complete search history.

(56) References Cited

U.S. PATENT DOCUMENTS

| | | | |
|---|---|---|---|
| 7,966,579 B2 | 6/2011 | Herold | |
| 8,010,915 B2 | 8/2011 | Chen et al. | |
| 8,281,264 B2 | 10/2012 | Zhang | |
| 8,316,327 B2 | 11/2012 | Herold | |
| 8,413,081 B2 | 4/2013 | Ye et al. | |
| 8,930,172 B2* | 1/2015 | Ye ........................... | G06F 17/10 |
| | | | 703/6 |
| 2008/0168419 A1 | 7/2008 | Burkhardt et al. | |
| 2011/0139027 A1* | 6/2011 | Hansen ............... | G03F 7/70125 |
| | | | 101/450.1 |
| 2011/0224956 A1* | 9/2011 | Ye .......................... | G03F 7/705 |
| | | | 703/1 |
| 2013/0203001 A1* | 8/2013 | Wang .................... | G03F 7/2022 |
| | | | 430/296 |
| 2014/0252639 A1* | 9/2014 | Okada ................... | H01L 23/528 |
| | | | 257/773 |

(Continued)

FOREIGN PATENT DOCUMENTS

| | | |
|---|---|---|
| JP | 2005-250360 A | 9/2005 |
| KR | 10-2005-0024667 A | 3/2005 |
| KR | 10-2005-0024668 A | 3/2005 |

*Primary Examiner* — Suchin Parihar
(74) *Attorney, Agent, or Firm* — Lee IP Law, P.C.

(57) ABSTRACT

In a method for minimizing optical proximity correction errors in a semiconductor pattern. The method includes modifying a mask in a quantized unit to reduce an edge placement error between a simulation layout shape and a target layout shape; adjusting a critical dimension (CD) error between a CD of the simulation layout shape and a CD of the target layout shape to generate an adjusted CD error by further modifying at least one side of the mask in a predetermined unit; and reforming the simulation layout shape by modifying each side of the mask with arbitrary correction values.

20 Claims, 12 Drawing Sheets

(56) References Cited

U.S. PATENT DOCUMENTS

| | | | |
|---|---|---|---|
| 2015/0185626 A1* | 7/2015 | Chen | G03F 7/705 |
| | | | 355/52 |
| 2017/0075228 A1* | 3/2017 | Ugajin | G03F 1/26 |
| 2017/0115556 A1 | 4/2017 | Shim et al. | |
| 2019/0049859 A1* | 2/2019 | Tsiatmas | G01J 3/18 |

\* cited by examiner

METHOD OF MINIMIZING ERRORS OF OPTICAL PROXIMITY CORRECTION IN SEMICONDUCTOR PATTERN AND DEVICE FOR PERFORMING THE SAME

CROSS-REFERENCE TO RELATED APPLICATION

Korean Patent Application No. 10-2018-0123979 filed on Oct. 17, 2018 in the Korean Intellectual Property Office, and entitled: "Method of Minimizing Errors of Optical Proximity Correction in Semiconductor Pattern and Device for Performing the same," is incorporated by reference herein in its entirety.

BACKGROUND

1. Field

Embodiments relate to a device and a method of minimizing optical proximity correction errors in a semiconductor pattern of a semiconductor device.

2. Description of the Related Art

As semiconductor devices have become highly integrated, widths and intervals of semiconductor patterns of the semiconductor devices have become finer. Further, as the semiconductor devices have become miniaturized, Photolithography equipment has had limitations in its precision. The limitations of the photolithography equipment have caused an optical proximity effect to make errors in the semiconductor patterns of the semiconductor device. Therefore, an optical proximity correction (OPC) technology for correcting errors of the semiconductor patterns has become more important.

The optical proximity correction (OPC) technology addresses a model error related to a simulation error and an optical proximity correction error related to an optical proximity solver. The optical proximity correction error is caused by inaccuracy of an OPC tool. As an error threshold value in a fine semiconductor process has been lowered, both the model error and the optical proximity correction error should be addressed to improve accuracy in semiconductor patterns of a semiconductor device.

SUMMARY

Embodiments are directed to a method for minimizing optical proximity correction errors in a semiconductor pattern comprising: modifying a mask in a quantized unit to reduce an edge placement error between a simulation layout shape and a target layout shape, the edge placement error including a critical dimension (CD) error corresponding to a difference between a CD of the simulation layout shape and a CD of the target layout shape; adjusting the CD error between the CD of the simulation layout shape and the CD of the target layout shape to generate an adjusted CD error by further modifying at least one side of the mask in a predetermined unit according to a comparison result, the comparison result being obtained by comparing an absolute value of the CD error between the CD of the simulation layout shape and the CD of the target layout shape with a predetermined error threshold value; and reforming the simulation layout shape by modifying each side of the mask with arbitrary correction values.

Embodiments are directed to a device for minimizing optical proximity correction errors in a semiconductor pattern comprising: an EPE corrector to modify a mask in a quantized unit to reduce an edge placement error between a simulation layout shape and a target layout shape, the edge placement error including a critical dimension (CD) error corresponding to a difference between a CD of the simulation layout shape and a CD of the target layout shape; a CD corrector to compare an absolute value of the CD error between the CD of the simulation layout shape and the CD of the target layout shape, which is derived by modifying the mask in the EPE corrector, with a predetermined error threshold value to generate a comparison result and to further modify at least one side of the mask in a predetermined unit according to the comparison result to obtain an adjusted CD error; and a shape disturbancer to modify each side of the mask with arbitrary correction values to reform the simulation layout shape.

BRIEF DESCRIPTION OF DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Figure 1:
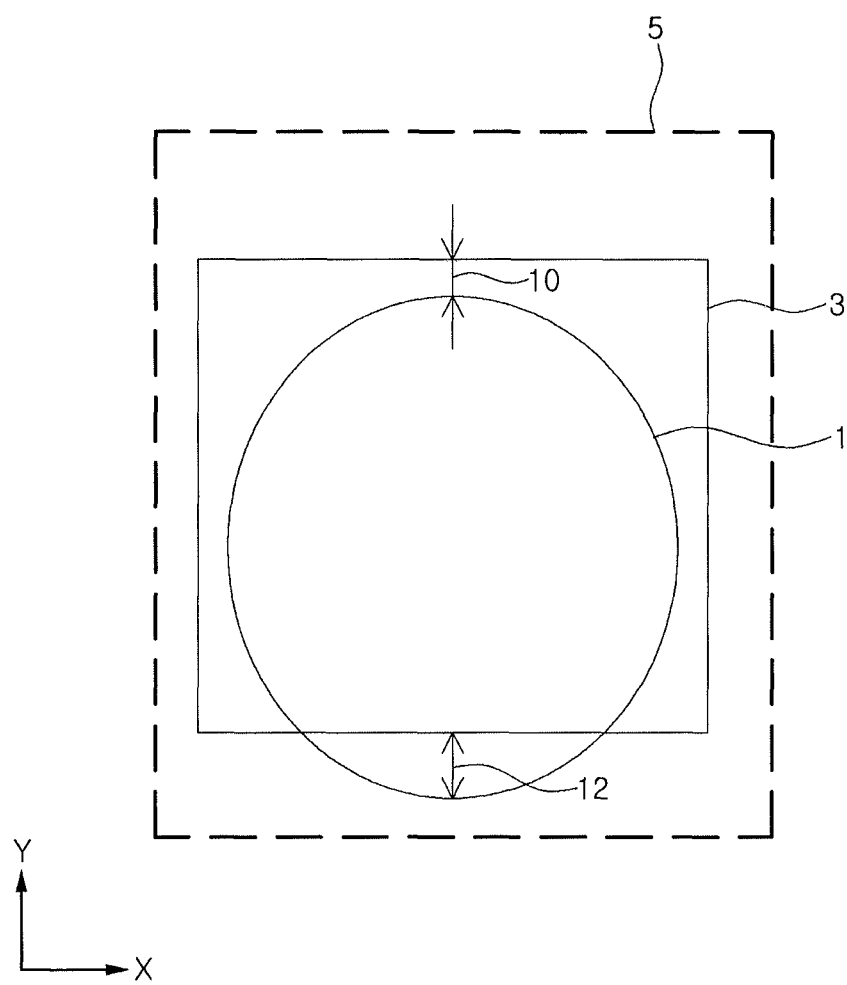
FIG. 1 illustrates a correction error among types of OPC errors.
Figure 2:
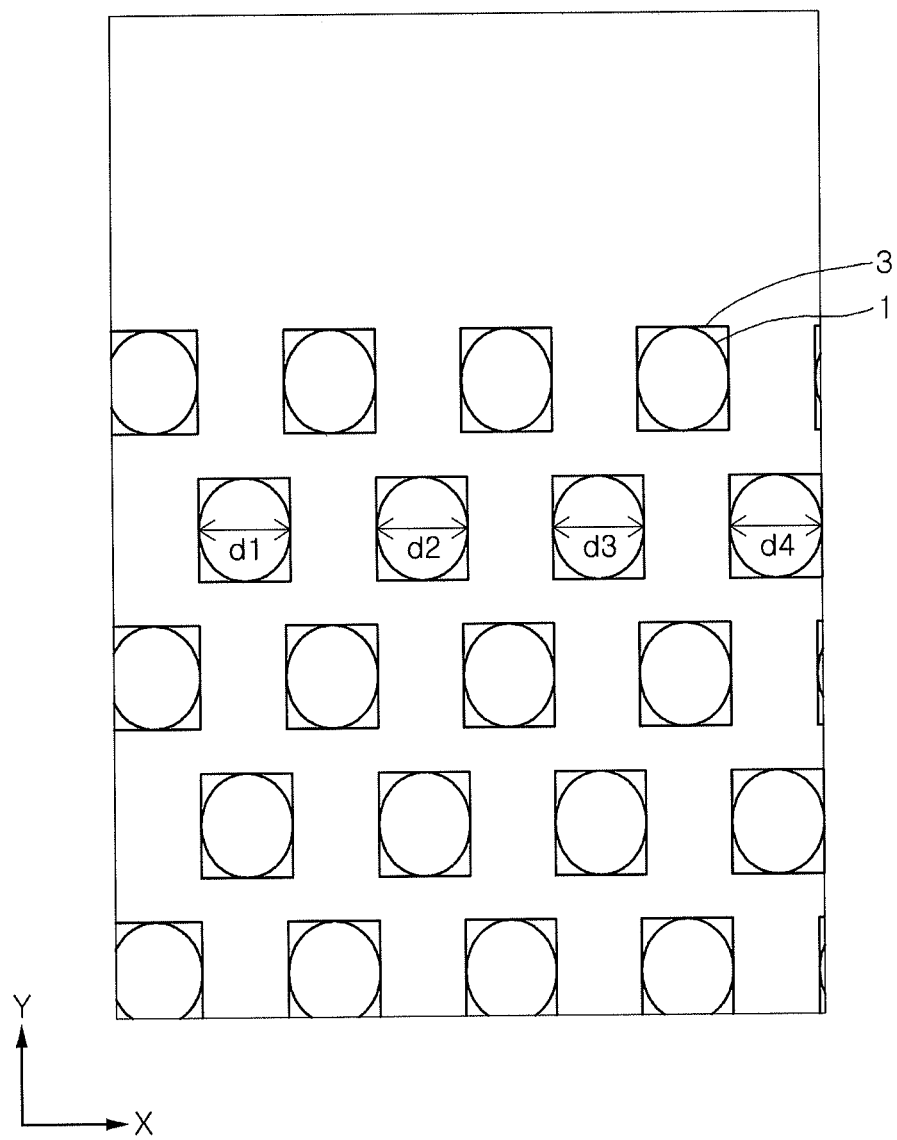
FIG. 2 illustrates a patch location error among types of OPC errors.

Exemplary Embodiments are related to devices and methods for minimizing an edge placement error and a patch location error among the devices. FIG. 1 illustrates an edge placement error among optical proximity correction (OPC) errors. FIG. 2 illustrates a patch location error among the OPC errors. The OPC errors may include an edge placement error, a grid error, a patch location error, and the like. The edge placement error may be a difference between a target layout shape and a simulation layout shape. For example, the target layout shape may be a designed layout pattern, and the simulation layout shape may be a layout pattern formed by light passing through a mask in a simulation process. The grid error may be occurred because the target layout shape is set or designed in a grid unit. The patch location error may be occurred because a critical dimension (CD) of the simulation layout shape changes according to a location of the simulation layout shape, and the like.

Referring to FIG. 1, reference numeral 5 denotes an outline of a mask, which may be corrected or treated by an optical proximity correction (OPC). Reference numeral 3 denotes an outline of a target layout shape for the OPC. Reference numeral 1 denotes an outline of a simulation layout shape. Reference numerals 10 and 12 denote an edge placement error (EPE). In a simulation process, it may be necessary to minimize the edge placement error (EPE) by approximating the simulation layout shape 1 to the target layout shape 3. In other words, the EPE may be minimized through reducing difference between the simulation layout shape 1 and the target layout shape 3.

Ideally, critical dimensions (CD) of simulation layout shapes, which are repeatedly arranged to form layout patterns, may be same as each other. However, a patch location error may be occurred because the CDs of the simulation layout shapes change according to locations of the layout patterns. For example, diameters d1, d2, d3, and d4 of simulation layout shapes in FIG. 2 may have numeral values (e.g., 77.848 nm, 77.89 nm, 77.906 nm, and 77.89 nm) that are slightly different from each other due to the patch location error thereof. Thus, it may be necessary to minimize OPC errors in the layout patterns in consideration of e.g., a patch location error.

Figure 3:
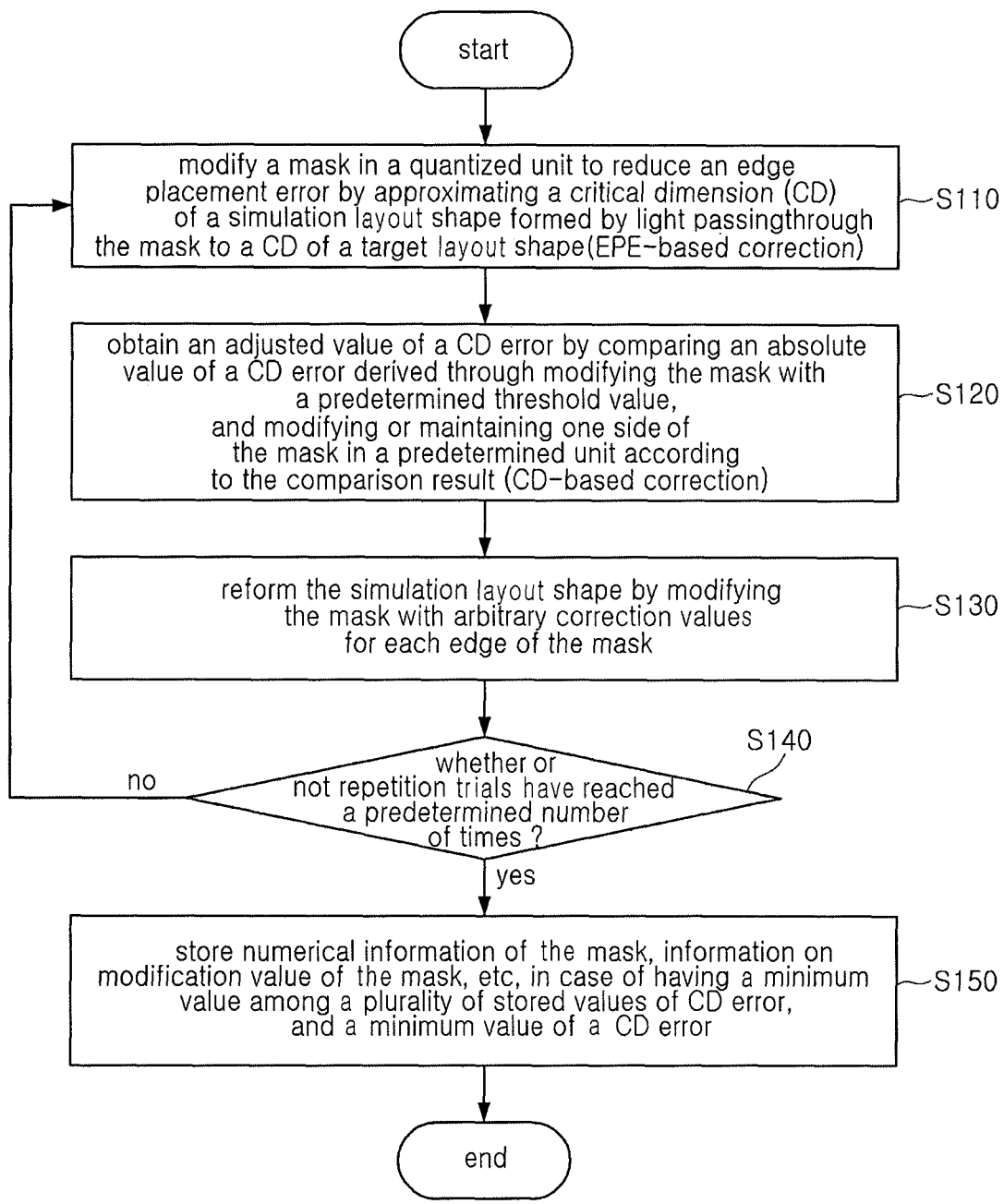
FIG. 3 illustrates a method for minimizing an optical proximity correction error in a semiconductor pattern.
Figure 4:
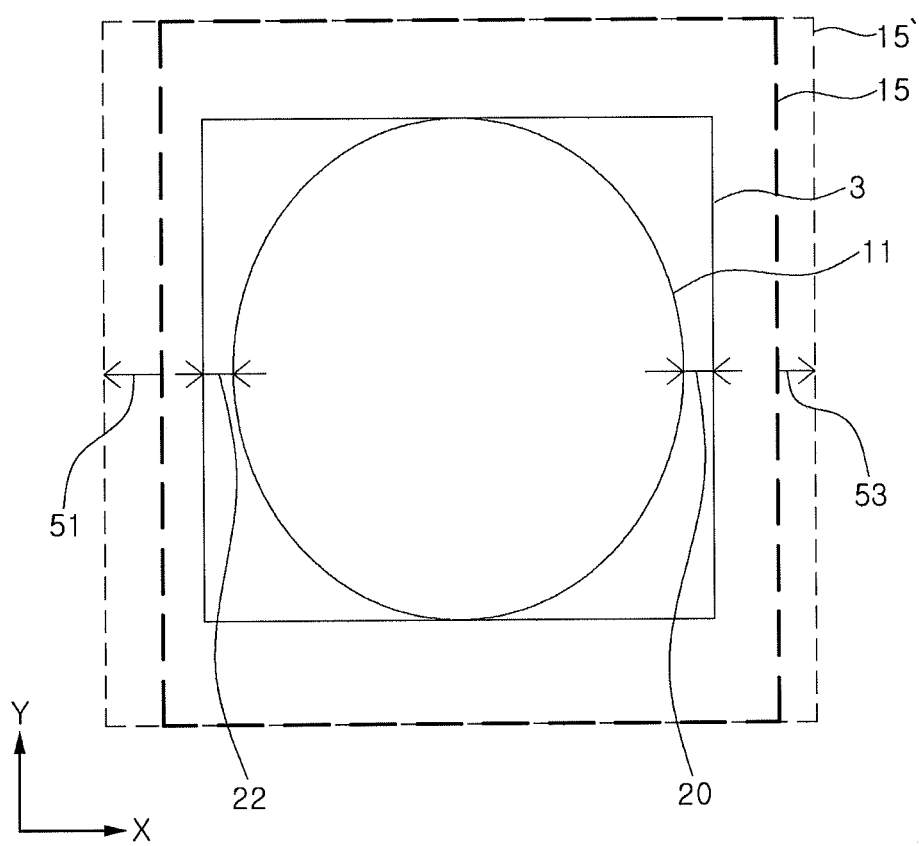
FIG. 4 illustrates an EPE-based OPC correction performed in operation S110 of FIG. 3.
Figure 5:
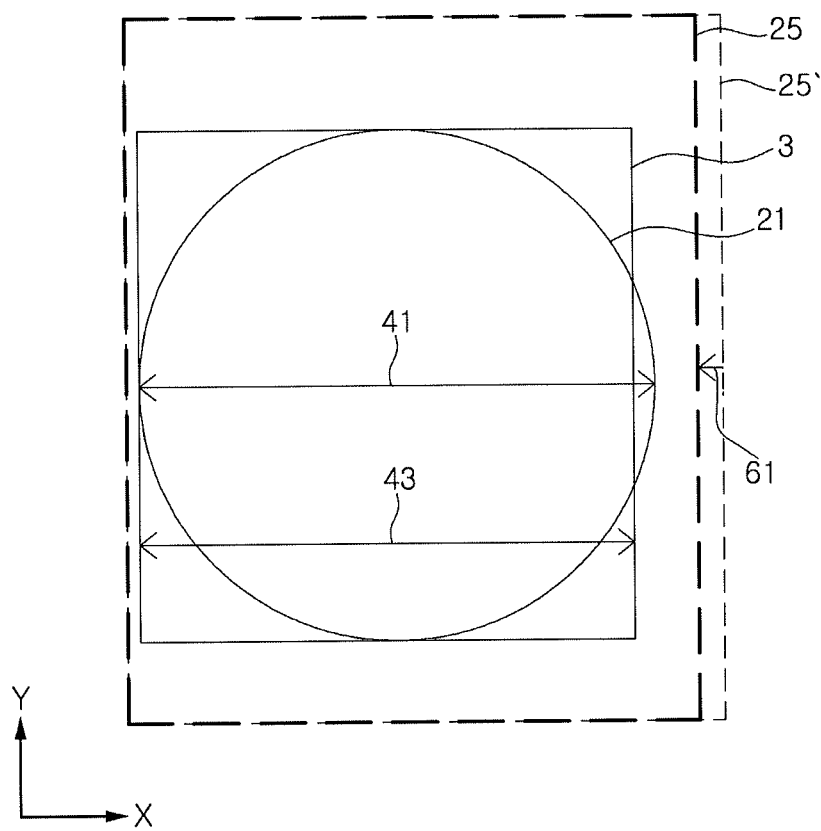
FIG. 5 illustrates a CD-based correction performed in operation S120 of FIG. 3.
Figure 6:
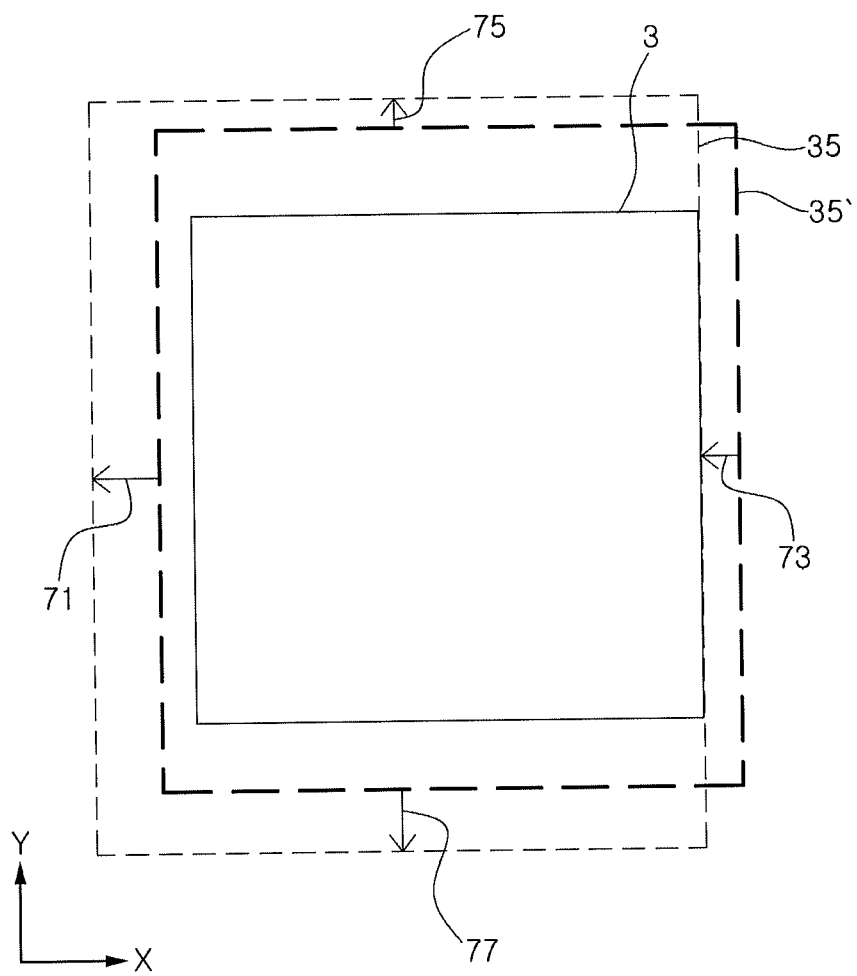
FIG. 6 illustrates a shape reformation performed in operation S130 of FIG. 3.
Figure 7:
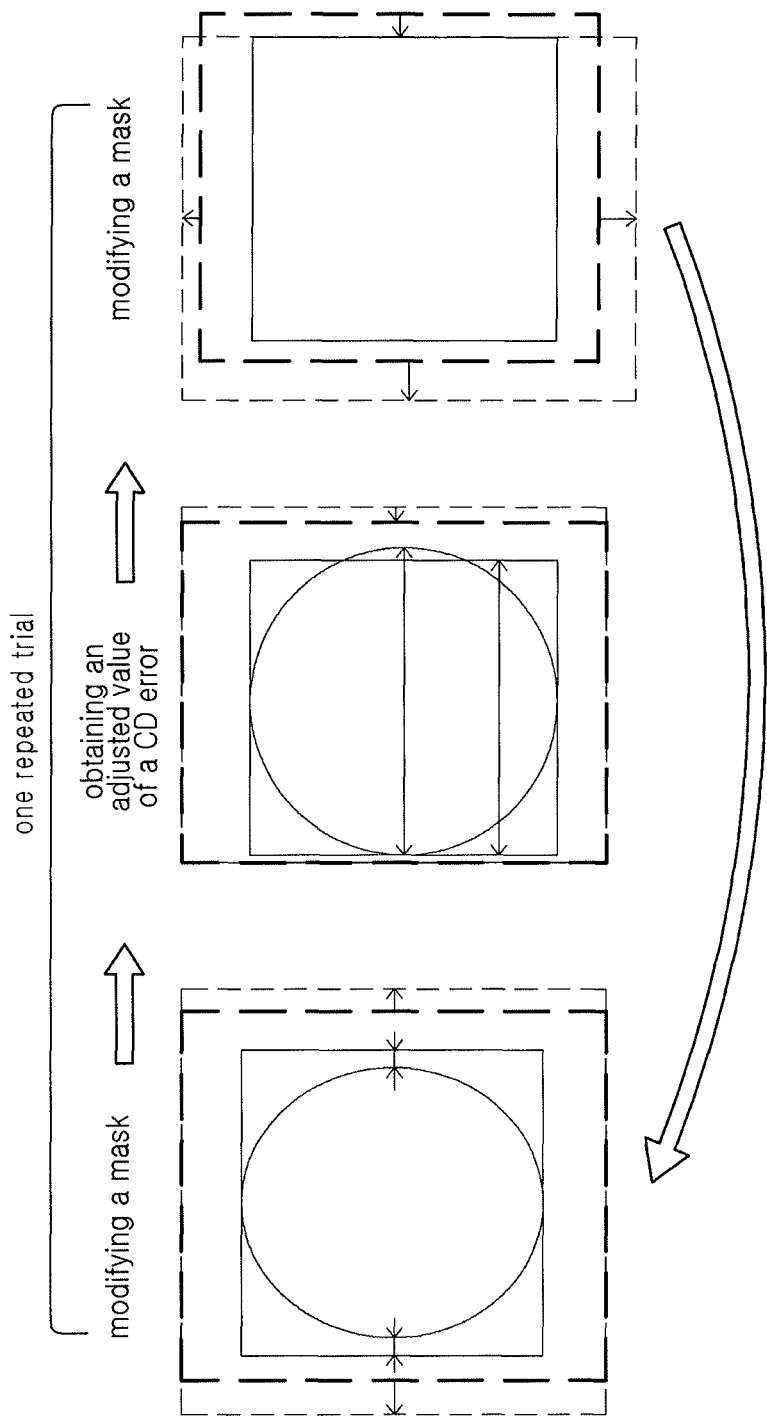
FIG. 7 illustrates operations S110 to S130 of FIG. 3 are repeatedly performed a plurality number of times.

FIG. 3 illustrates a method for minimizing an optical proximity correction (OPC) error in a semiconductor pattern according to an exemplary embodiment. FIG. 4 illustrates an EPE-based OPC correction, which is performed based on an edge placement error (EPE) in operation S110 of FIG. 3. FIG. 5 illustrates a CD-based correction, which is performed based on a critical dimension (CD) in operation S120 of FIG. 3. FIG. 6 illustrates a shape reformation, which is performed through disturbance in operation S130 of FIG. 3. FIG. 7 illustrates that operations S110 to S130 of FIG. 3 are repeatedly performed one or more times.

Referring to FIG. 3, a method for minimizing optical proximity correction (OPC) errors in a semiconductor pattern according to an exemplary embodiment may include: modifying a mask in a quantized unit to reduce an edge placement error (EPE) between a simulation layout shape and a target layout shape by approximating a critical dimension (CD) of the simulation layout shape to a CD of the target layout shape (S110), i.e., by reducing a CD error corresponding to a difference between the CD of the simulation layout shape and the CD of the target layout shape; adjusting the CD error between the CD of the simulation layout shape and the CD of the target layout shape obtaining an adjusted value of the CD error to generate an adjusted CD error by further modifying at least one side of the mask in a predetermined unit according to a comparison result, which is obtained by comparing an absolute value of the CD error with a predetermined error threshold value (S120); and reforming the simulation layout shape by modifying each side of the mask with arbitrary correction values (S130).

A first mask modification, which is performed in the operation S110, may be for an EPE-based OPC correction to reduce an edge placement error (EPE) between a CD of a target layout shape and a CD of a simulation layout shape. For example, referring to FIG. 4, edge placement errors (EPE) 20 and 22 may be differences between a target layout shape 3 and a simulation layout shape 11 at opposite sides of the target layout shape 3. First edge placement errors (e.g., 10 in FIGS. 1 and 20 and 22 in FIG. 4) may be negative values because an outline of the simulation layout shape 11 is inside of an outline of the target layout shape 3. A second edge placement error (e.g., 12 in FIG. 1) may be a positive value because the outline of the simulation layout shape 1 is outside of the outline of the target layout shape 3. Meanwhile, a mask 15 may be modified to a mask 15' in a grid unit to reduce the first and second edge placement errors (e.g., 10 and 12 in FIGS. 1 and 20 and 22 in FIG. 4). For example, referring to FIG. 4, when the mask 15 is modified to the mask 15', a left side of the mask 5 may be moved in a left direction by 4 grid units, and a right side of the mask 5 may be moved in a right direction by 2 grid units. Thus, the first mask modification may be limited to the grid unit. In other words, the first mask modification may be performed in a quantized unit corresponding to the grid unit. The grid unit may be, e.g., 1 nm, 0.1 nm, or the like.

Exemplary embodiments will be described based on the grid unit of 0.1 nm. For example, when the edge placement error is 0.15 nm, a shape of the mask may be changed by the grid unit to reduce the edge placement error between the simulation layout shape and the target layout shape. For example, when the shape of the mask is changed or modified by the grid unit of 0.1 nm, the simulation layout shape, which is formed by light passing through the modified mask, may be changed or modified by a range of, e.g., 0.1 to 0.3 nm or beyond. As the modification range of the simulation layout shape may depend on the surrounding environment, it is difficult to exactly predict the modification range of the simulation layout shape. Thus, it may be necessary to perform simulations several times for exactly predicting the modification range of the simulation layout shape.

As describe above, the first mask modification for reducing the edge replacement error may increase the edge replacement error because the modification range of the simulation layout shape is beyond the edge placement error (i.e., 0.15 nm). To prevent from increasing the edge replacement error by the first mask modification, it may be determined whether the first mask modification is performed or not based on an absolute value obtained by multiplying the edge placement error (i.e., 0.15 nm) by a constant damping value. The constant damping value may be lower than 1.

For example, when the edge placement error is 0.15 nm, and the damping value is −0.3, the absolute value obtained by multiplying the edge placement error by the damping value may be 0.045 nm, which is lower than the grid unit of 0.1 nm. Thus, the first mask modification for the EPE-based correction may not be performed because the first mask modification may increase the edge placement error of 0.15 nm. For example, when the edge placement error is 0.42 nm, and the damping value is −0.3, the absolute value obtained by multiplying the edge placement error by the damping value may be 0.126 nm, which is greater than the grid unit of 0.1 nm. Thus, the first mask modification for the EPE-based correction may be performed to reduce the edge placement error of 0.42 nm.

The EPE-based correction may be performed by modifying opposite sides or opposite edges of a mask facing each other. Referring to in FIG. 4, opposite sides (i.e., left and right sides) of the mask 15 may move in an outward direction (51 and 53) to correct the edge placement errors 20 and 22 because an outline of the simulation layout shape 11 is inside of an outline of the target layout shape 3. The moving distance of the opposite edges of the mask 15 may be a value obtained by multiplying the edge placement errors 20 and 22 by a predetermined damping value.

In an exemplary embodiment, the EPE-based correction may be repeatedly performed until all of semiconductor patterns in a single performance unit are corrected by on the repeated EPE-base corrections. For example, five (5) semiconductor pattern shapes may have ten (10) critical dimensions (CD)s in up-and-down directions and left-and-right directions, respectively. When the five (5) semiconductor pattern shapes are set as the single performance unit, the EPE-based correction may be repeatedly performed on the ten (10) CDs in the single performance unit until all of the ten (CD)s of the five (5) semiconductor pattern shapes are corrected by the on the repeated EPE-base corrections.

An adjustment of a critical dimension (CD) error between a CD of a target layout shape and a CD a simulation layout shape, which is performed in the operation S120, may be related to a CD-based correction. For example, the adjusted CD error may be obtained by comparing an absolute value of the CD error obtained in the operation S110 with a predetermined error threshold value to generate a comparison result and by modifying or maintaining at least one side or edge of a mask in a predetermined unit according to the comparison result. Referring to FIG. 5, a critical dimension (CD) error between a CD 41 of a simulation layout shape 21 and a CD 43 of a target layout shape 23 may be occurred at a right side or edge of the target layout shape 3. The CD error may not be occurred at a left side or edge of the target layout shape 3. Thus, a right side or edge of a mask 25 may be modified in an inward direction (i.e., left direction) by a predetermined unit to correct the CD error at the right side or edge of the target layout shape 3 and to obtain an adjusted value of the CD error. Here, the predetermined unit may be a minimum value by which the mask 25' is able to be moved or modified in one time.

Meanwhile, the predetermined error threshold value may be determined in consideration of a magnitude of the predetermined unit. As described above, referring to FIG. 4, a movement/modification range of the simulation layout shape 11 in response to a movement/modification of the mask 5 changes according to a surrounding environment. Thus, the movement/modification range of the simulation layout shape 11 may not be precisely predicted when the mask moves by a certain distance. Assuming that the simulation layout shape 11 moves by a range of about 0.2 to 0.3 nm when the mask 15 moves by 0.1 nm, the predetermined error threshold value may be determined to be, e.g., 0.2 nm.

Meanwhile, when both a left CD error (e.g., 22 in FIG. 4) at a left edge of a target layout pattern and a right CD error (e.g., 20 in FIG. 4) at a right edge of the target pattern are occurred, the left CD error and the right CD error may be added together to generate a total CD error. For example, when each of the left CD error and the right CD error is 0.15 nm, a sum of the left and right CD errors (as the total CD error) may be 0.3 nm. Thus, when the sum of the left and right CD errors is multiplied by the damping value of −0.3, an absolute value of the multiplication result (i.e., 0.09 nm) may be smaller than the grid unit of 0.1 nm. Therefore, in this case, the left and right CD errors may not be further corrected. In other words, additional modification of a mask for reducing the left and right CD errors may not be performed. The additional modification of the mask may be related to an EPE-based correction. Further, as the sum of the left and right CD errors is 0.3 nm, the sum of the left and right CD errors may be greater than the predetermined error threshold of 0.2 nm. Thus, a CD-based correction may be further performed on the left and right CD errors to reduce the sum of the left and right CD errors, which is obtained through the EPE-based correction as described above. In this manner, a reduced value of the sum of the left and right CD errors, which is obtained by the CD-based correction may be lower than a value of the sum of the left and right CD errors, which is obtained only by the EPE-based correction.

For example, in a CD-based correction, when an absolute value of a CD error is greater than a predetermined error threshold value, at least one side or edge of a mask may be modified by a predetermined unit to reduce the absolute value of the CD error and to store the reduced value of the CD error. When the absolute value of the CD error is smaller than the predetermined error threshold value, the CD-based correction may not be further performed, and the reduced absolute value of the CD error may be stored.

Further, the CD-based correction, which is performed in the operation S120, may be also repeatedly performed until the CD-based correction may be performed on all of CDs of simulation layout shapes having a certain number of semiconductor patterns in a similar manner to the EPE-based correction as described above.

In the operation S130, each edge of a mask may be randomly modified with arbitrary correction values to reform another simulation layout shape based on the randomly modified mask. Further, the EPE-based correction and the CD-based correction as described above may be sequentially performed on the reformed simulation layout shape (e.g., in FIG. 7) to obtain a further adjusted value of a CD error between a target layout shape and the reformed simulation layout shape. The EPE-based correction and the CD-based correction may be repeated a predetermined number of times.

FIG. 6 illustrates that a mask 35 is modified into a modified mask 35'. For example, asymmetrical or symmetrical modifications may be applied to four sides or edges (e.g., upper, bottom, left, and right sides or edges) of the mask 35. Further, the number of the asymmetrical or symmetrical modifications may be preset to a certain number. For example, when the number of modifications for each of the four sides or edges of the mask 25 is five, and five semiconductor patterns, which are formed with five masks 25, are set as one unit, the number of asymmetric modifications of the five masks 25 may be up to $5^{20}$ $^{(i.e.,\ four\ sides*five\ masks)}$ times, and the number of symmetrical modifications thereof may be up to $5^{10}$ $^{(i.e.,\ four\ sides*five\ masks)}$ times. As it may be inefficient to simulate all the cases, the simulation may be repeated by a predetermined number of times, e.g., several hundreds of times.

For example, when an EPE-based correction and a CD-based correction are repeated to obtain adjusted values of CD errors, correction values applied to a modification of a mask may be different each time. As described above, values of CD errors, which are obtained by repeating an EPE-based correction and a CD-based correction and by applying different correction values thereto each time, may be stored.

Figure 10:
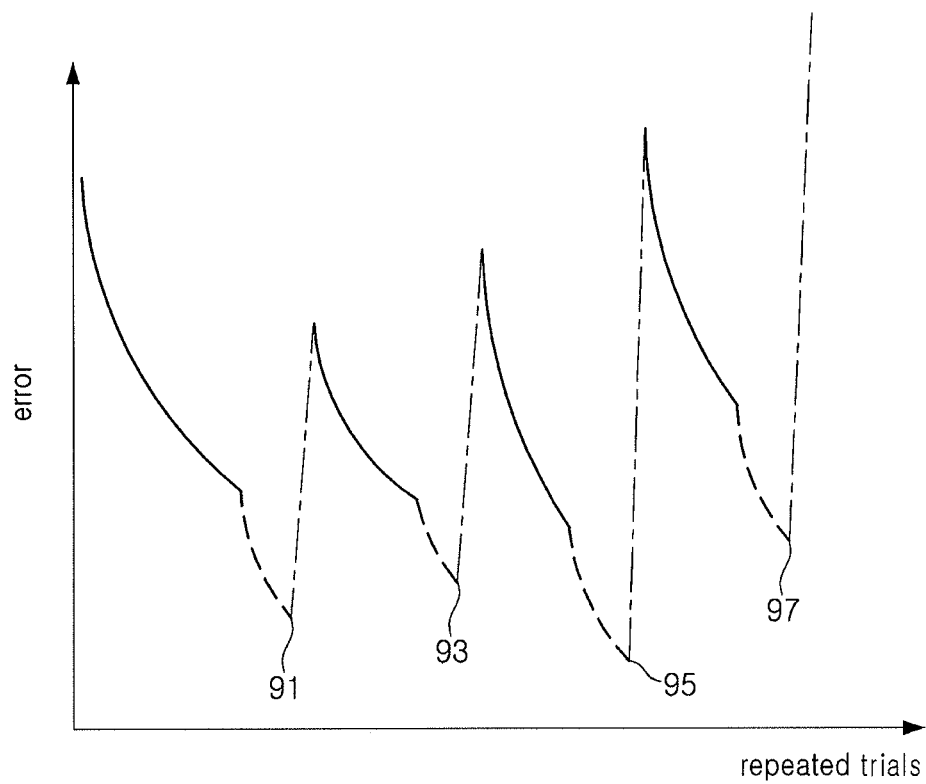
FIG. 10 illustrates changes in error values obtained when operations S110 to S130 of FIG. 3 or processes of operations S210 to S240 of FIG. 8 are repeatedly performed a plurality number of times.

For example, the values of the CD errors, which are obtained with the different correction values, may have different values at each of different repetitions of the EPE-based correction or the CD-based correction. FIG. 10 illustrates changes in error values when processes of operations S110 to S130 are repeatedly performed a plurality number of times. In other words, repeated trials may be performed a predetermined number of times. Each repeated trial may include the EPE-based correction and the CD-based correction. Points indicated by 91, 93, 95, and 97 in FIG. 10 may be values of CD errors obtained by performing each repeated trial each time. In this manner, different values of CD errors, which are obtained by repeatedly performing operations in the operation S110 and the operation S120, may be stored. Further, it may be determined whether the predetermined number of times has been reached (S140). For example, when the predetermined number of times has elapsed, a minimum value among the stored values of the CD errors may be extracted. When the minimum value of the CD errors is obtained in a determined trial, at least one of numerical information of the mask in the determined trial, modification information of the mask in the determined trial, and the minimum value of the CD errors may be stored. Thus, the numerical information of the mask in the determined trial, modification information of the mask in the determined trial, and the minimum value of the CD errors may be obtained by simulation in advance. Therefore, optical proximity correction errors of semiconductor patterns, which are formed with the modified mask, may be minimized by applying the information, which minimizes the value of the CD error and is obtained through the simulation in advance, to an actual process or a physical process.

Figure 8:
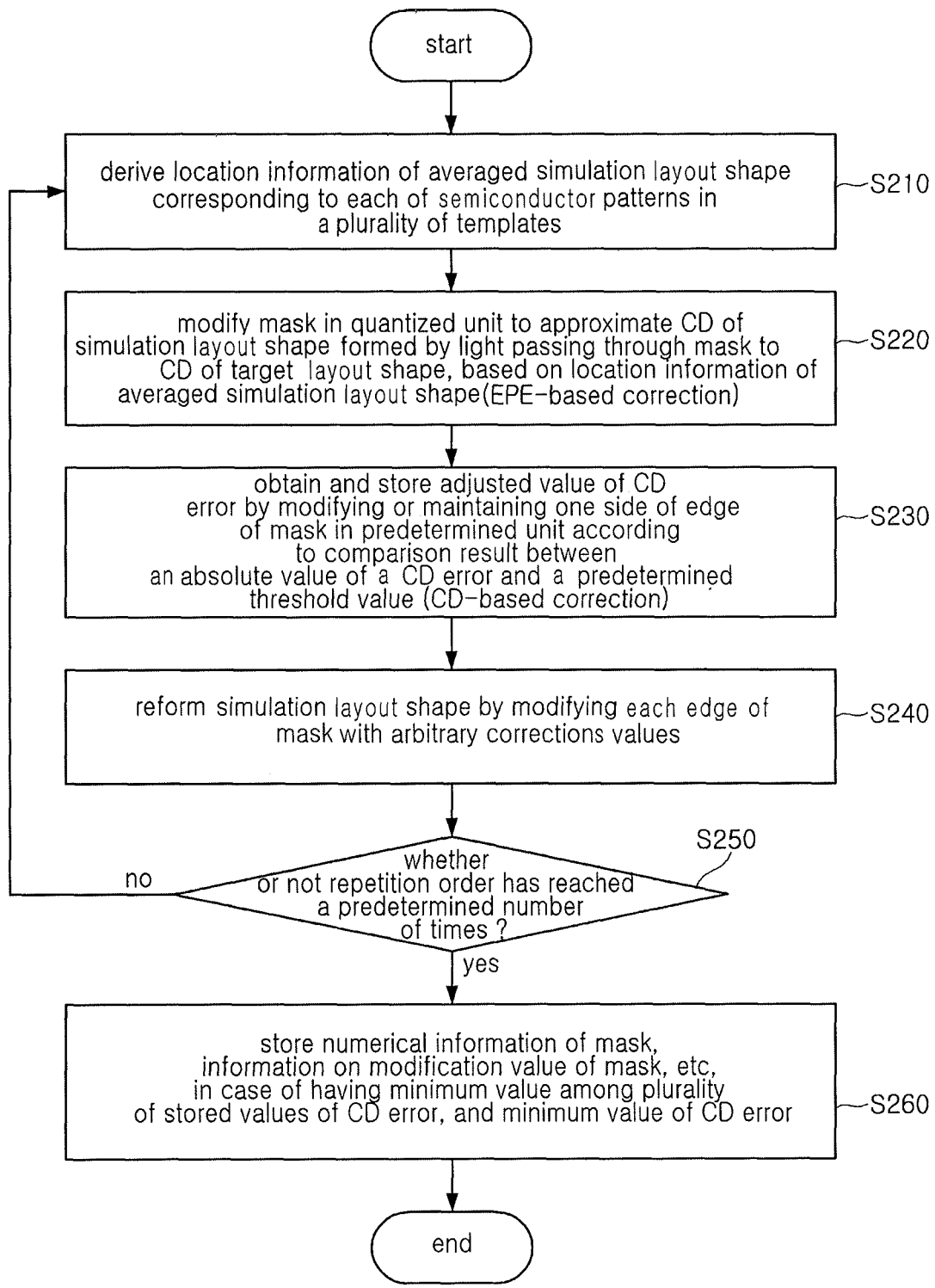
FIG. 8 illustrates a method of minimizing an optical proximity correction error in a semiconductor pattern.
Figure 9:
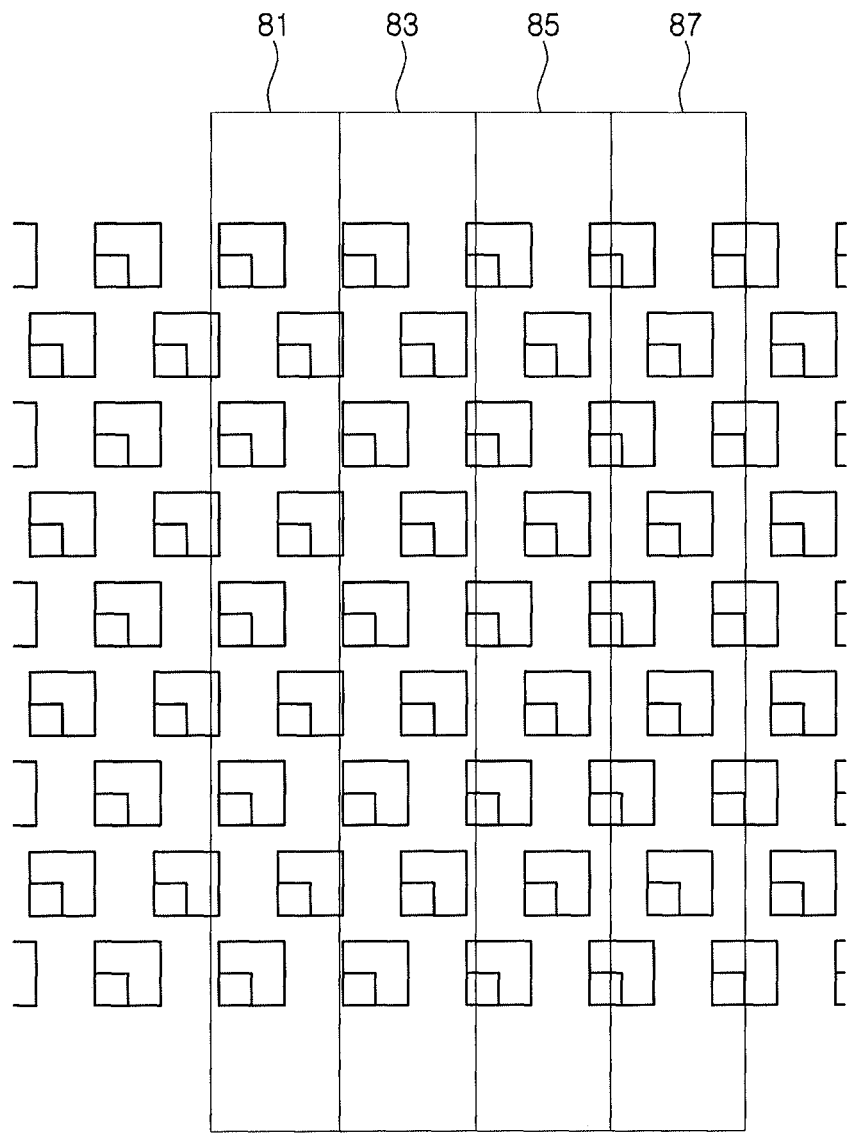
FIG. 9 illustrates an embodiment of a plurality of templates on a semiconductor pattern.
Figure 11:
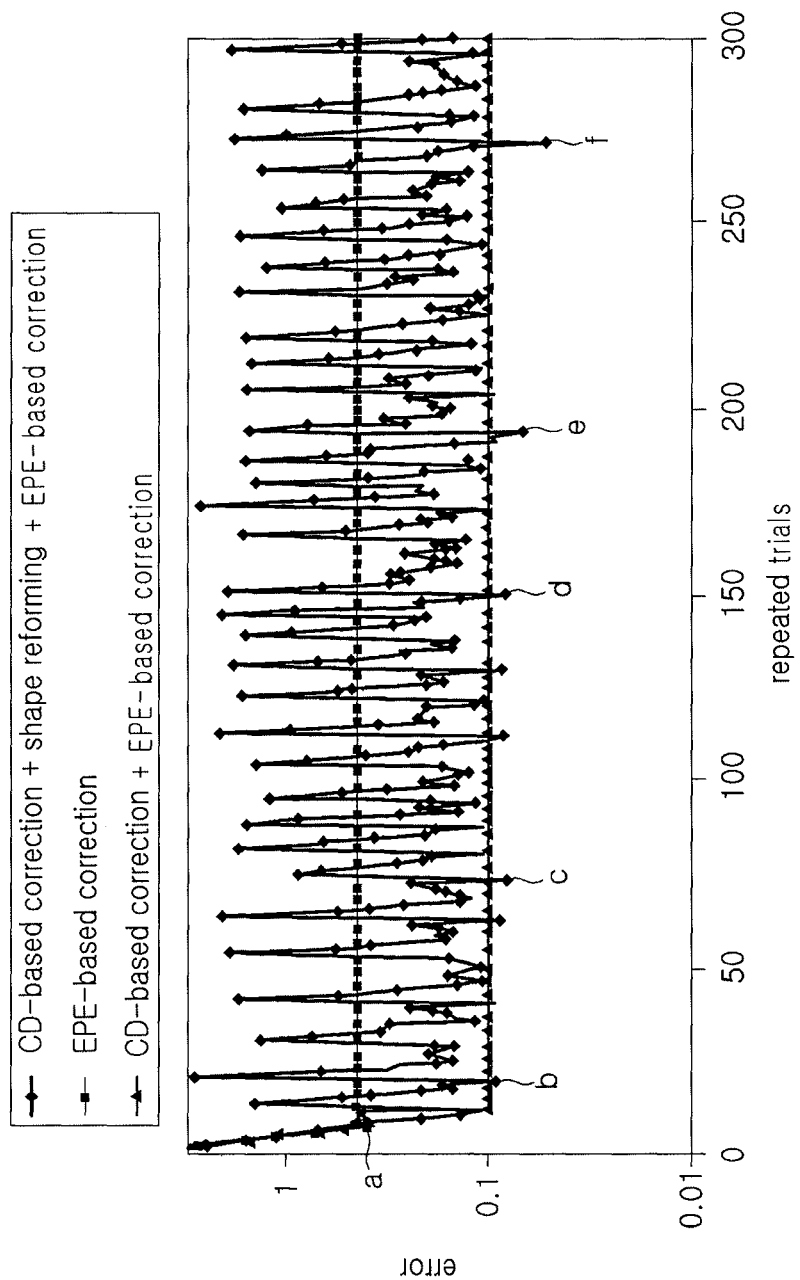
FIG. 11 illustrates error values obtained when simulations are repeatedly performed with various correction methods.

FIG. 8 illustrates a method for minimizing an optical proximity correction error of a semiconductor pattern according to another embodiment. FIG. 9 illustrates a plurality of templates on a semiconductor pattern. FIG. 10 illustrates changes in error values when processes of operations S110 to S130 of FIG. 3 or processes of operations S210 to S240 of FIG. 8 are repeated a plurality number of times. FIG. 11 illustrates error values when repeated simulations are performed by applying various correction methods.

Referring to FIG. 8, a method for minimizing optical proximity correction errors in a semiconductor pattern according to another embodiment may include: an operation to extract location information of an averaged simulation layout shape corresponding to each of semiconductor patterns in a plurality of templates (S210); an EPE-based correction operation for modifying a mask in a quantized unit to reduce an edge placement error to approximate a critical dimension (CD) of a first simulation layout shape, which is formed by light passing through the mask, to a CD of a target layout shape based on the location information of the averaged simulation layout shape (S220); a CD-based correction operation of obtaining and storing an adjusted value of a CD error by modifying or maintaining one side of edge of mask in a predetermined unit according to a comparison result between an absolute value of a CD error and a predetermined error threshold value (S230); and an operation for forming a second simulation layout shape by modifying each edge of a mask with arbitrary correction values (S240).

Another embodiment illustrated in FIG. 8 may further include an operation for minimizing a patch location error, compared to an embodiment illustrated in FIG. 3. As illustrated in FIG. 9, layout shapes formed on a semiconductor device may be divided into a plurality of templates. As the layout shapes formed on the semiconductor device may be repeatedly arranged, the layout shapes may be divided into groups of layout shapes, and each group of layout shapes may be set as one template in consideration of the repeated pattern of the layout shapes. For example, each of templates 81, 83, 85, and 87 is set to include about nine (9) layout shapes in FIG. 9.

As described above with reference to FIG. 2, layout shapes included in each of a plurality of templates may have a patch location error because CDs of simulation layout shapes may change according to locations of the simulation layout shapes. FIG. 8 illustrates that location information of an averaged simulation layout shape corresponding to layout patterns in a plurality of templates may be obtained. In an embodiment illustrated in FIG. 8, an EPE-based correction and a CD-based correction may be repeatedly performed based on the location information of the averaged simulation layout shape. The location information of the average simulation layout shape may be applied to repeat a first operation (e.g., an EPE-based correction), a second operation (e.g., a CD-based correction), and a third operation (e.g., a shape reformation). A repetition operation of the first to third operations may be similar to the operations described with reference to FIG. 3. For example, the first to third operations may be repeated a predetermined number of times to perform repeated trials. Each repeated trial may include the first to third operations. A value of a CD error obtained in the second operation may be stored by each of repeated trials of a predetermined number of times. After the repeated trials of the predetermined number of times are completed, a minimum value among a plurality of values of CD errors, which are obtained in the repeated trials, may be extracted. A determined trial among the repeated trials may be determined when the minimum value is extracted in the determined trial. For example, when the minimum value is extracted in the determined trial, at least one of numerical information of the mask in the determined trial, modification information of the mask in the determined trial, and the minimum value of the CD errors in the determined trial may be stored. Further, the correction error and the patch location error may be minimized by applying the optimal numerical information of the mask in the determined trial, which is obtained by a simulation, to an actual process.

Figure 12:
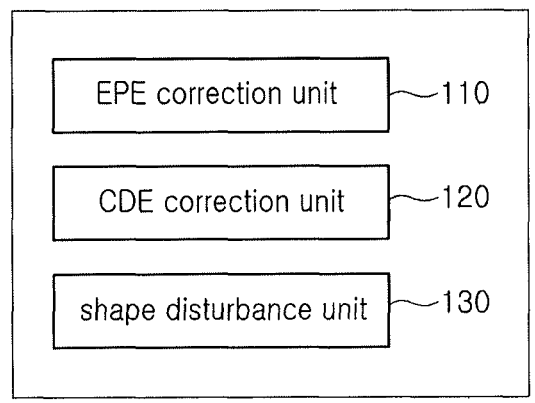
FIG. 12 illustrates an embodiment of a device for minimizing an optical proximity correction error of a semiconductor pattern.
Figure 13:
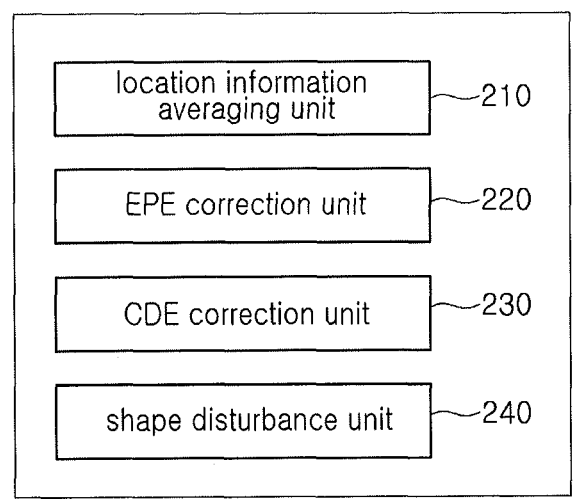
FIG. 13 illustrates another embodiment of a device for minimizing an optical proximity correction error of a semiconductor pattern.

FIG. 12 illustrates a device for minimizing an optical proximity correction error of a semiconductor pattern according to an exemplary embodiment. FIG. 13 illustrates a device for minimizing an optical proximity correction error of a semiconductor pattern according to another embodiment.

A device for minimizing optical proximity correction errors in a semiconductor pattern according to an exemplary embodiment in FIG. 12 may include an EPE correction unit 110, a CD correction unit 120, and a shape disturbance unit 130.

The EPE correction unit 110 may modify a mask by a quantized unit to reduce an edge placement error by approximating a CD of a simulation layout shape, which is formed by light passing through the mask, to a CD of a target layout shape. The operation of the EPE correction unit 110 may correspond to an EPE-based correction, e.g., modifying a mask in a quantized unit, as described in FIGS. 3 and 8.

The CD correction unit 120 may compare an absolute value of a CD error between the simulation layout shape and the target layout shape derived by modifying the mask in the EPE correction unit 110 with a predetermined error threshold value, and modify or maintain at least one side or edge of the mask by a predetermined unit according to a comparison result between the absolute value of the CD error and the predetermined error threshold value to obtain an adjusted value of the CD error. The operation of the CD correction unit 120 may correspond to a CD-based correction obtaining an adjusted value of a CD error, as described in FIGS. 3 and 8. Here, the predetermined unit may be a minimum unit by which the mask may be able to be modified.

For example, when the absolute value of the CD error is greater than a predetermined error threshold value, the CD correction unit 120 may modify the one side or edge of the mask by a predetermined unit to reduce the CD error. Further, when the absolute value of the CD error is smaller than the predetermined error threshold value, the value of the CD error may not be further corrected and may be stored without further modifying the mask.

The shape disturbance unit 130 may modify each edge of the mask with an arbitrary correction value a predetermined number of times to reform the simulation layout shape. For example, each edge of the mask may be modified with arbitrary correction values that are different by each of the predetermined number of times. For example, when the mask has first, second, third, and fourth sides, the first, second, third, and fourth sides of the mask may be modified by different distances, which are randomly determined. This operation may correspond to a shape reformation reforming a simulation layout shape, as described in FIGS. 3 and 8.

For example, when a multiplication value, which is obtained by multiplying an absolute value of an edge placement error by a predetermined damping value, is greater than a quantized unit, the EPE correction unit 110 may modify the mask to approximate a critical dimension (CD) of a simulation layout shape to a CD of a target layout shape. Here, the quantized unit may be a minimum grid unit in which the mask is able to be modified.

Meanwhile, as described above, a plurality of layout shapes in one template may be repeatedly arranged to form semiconductor patterns. Further, a critical dimension (CD) of a simulated shape and a CD of a target layout shape may include a horizontal axis CD and a vertical axis CD, respectively. The EPE correction unit 110 and the CD correction unit 120 may perform correction operations on the horizontal or vertical CDs of the plurality of layout shapes in the one template.

For example, the shape disturbance unit 130 repeatedly modifies at least one edge of the mask with arbitrary correction values that are different by each of a predetermined number of times, and then the EPE correction unit 110 may further modify the mask by a quantized units to approximate the CD of the simulation layout shape, which is formed by light passing through the mask, to the CD of the target layout shape. Further, the CD correction unit 120 may store an adjusted value of a CD error between the simulation layout shape and the target layout shape according to a comparison result between an absolute value of the CD error between the simulation layout shape and the target layout shape, which is obtained after modifying the mask by the EPE correction unit 110, and a predetermined error threshold value. For example, the CD correction unit 120 may store adjusted values of CD errors in a plurality of repetitions of operations of the shape disturbance unit 130, the EPE correction unit 110, and the CD correction unit 120.

Thereafter, the shape disturbance unit 130 may determine a determined trial among a plurality of repeated trials when a minimum value among the adjusted values of the CD errors is obtained in the determined trials, after all the plurality of repeated trials are completed. For example, when the minimum value among the adjusted values of the CD errors in the determined trial, at least one of numerical information of the mask in the determined trials, modification information of the mask in the determined trial, and the minimum value of the CD errors in the determined trial is stored to reuse the information to a subsequent process.

FIG. 13 illustrates a location information averaging unit 210, which is further included, compared to the embodiment of FIG. 12. As described above, a plurality of shapes as one template may repeatedly arranged to form semiconductor patterns. The location information averaging unit 210 may derive location information of an averaged simulation layout shape corresponding to each of patterns in a plurality of templates, and may provide the location information of the average simulation layout to the EPE correction unit 220. Repetition operations of the location information averaging unit 210, a EPE correction unit 220, a CDE correction unit 230, and a shape disturbance unit 24 may be repeatedly performed a plurality number of times. For example, when a minimum value among adjusted values of CD errors in the repetition operations is obtained in a first repetition operation of the repetition operation, at least one of numerical information of a mask in the first repetition operation, modification information of the mask in the first repetition operation, and the minimum value of the CD errors is stored to reuse the information to a subsequent process.

The functions and embodiments performed by the device for minimizing optical proximity correction errors in semiconductor patterns, as illustrated in FIGS. 12 and 13, may be similar to those described in each operation of the method for minimizing optical proximity correction errors in semiconductor patterns, as described with reference to FIGS. 3 and 8.

FIG. 11 illustrates three curves including a first curve, a second curve, and a third curve. For example, the first curve may show CD errors between a simulation layout shape and a target layout shape after repeatedly performing only an EPE-based correction. The second curve may show CD errors between a simulation layout shape and a target layout shape after repeatedly performing an EPE-based correction and a CD-based correction. The third curve may show CD errors between a simulation layout shape and a target layout shape after repeatedly performing an EPE-based correction, a CD-based correction, and a shape reforming.

For example, as illustrated in FIG. 11, when only the EPE-based correction is repeatedly performed a plurality number of times, minimum CD errors in the plurality of times may not be lowered than a certain level (e.g., a level of 'a' point of about 0.435 nm in FIG. 11).

For example, when the EPE-based correction and the CD-based correction are repeatedly performed a plurality number of times, minimum CD errors in the EPE-based and CE-based corrections of the plurality of times may be converged to about 0.1 nm, as illustrated in FIG. 11. For example, the minimum CD errors in the EPE-based and CE-based corrections of the plurality of times may be a value of about 0.102 nm (e.g., 'b' point in FIG. 11).

A predetermined unit for a mask, by which the mask is able to be moved or modified, may be set as 0.1 nm. For example, the EPE-based correction and the CD-based correction are repeatedly performed a plurality number of times until minimum CD errors in the EPE-based correction and the CD-based correction of the plurality of times may be very close to the predetermined unit of 0.1 nm.

Meanwhile, regarding the third curve, when the shape reformation operation is further performed after the EPE-based correction and the CD-based correction, the CD errors may be fluctuated with respect to the value of 0.1 nm. For example, repeated trials may be performed a plurality number of times. Each repeated trial may include the EPE-based correction, the CD-based correction, and the shape reformation operation. In other words, when each repeated trial is repeatedly performed in a plurality number of times, minimum CD errors in each of the repeated trials may be lowered than the predetermined unit of 0.1 nm. This may be because a simulation layout shape after the CD-based correction may be randomly modified to an arbitrary correction value to perform a correction again. This may lead to cases in which the mask has values much lower than the smallest movable unit in the course of about a few hundred operations. For example, the CD errors at 'c' to 'f' points in FIG. 11 may be 0.084904, 0.084715, 0.069904, and 0.053853, respectively. The smallest CD error among the CD errors at the 'c' to 'f' points may be the CD error at the 'f' point. Thus, a mask location information at the 'f' point and various modification values applied at the T point may be extracted. For example, when the CD error at the T point is extracted in a determined trial among the plurality of repeated trials, a mask location information in the determined trial and various modification values applied in the determined trial may be extracted.

As described above, according to a method and a device for minimizing the optical proximity correction (OPC) errors in a semiconductor pattern, an optical proximity correction based on an edge placement error, a CD-based correction, and an optimally adjusted value of a CD error by arbitrarily modifying a mask a plurality of times may be extracted in a simulation process to minimize the OPC errors in an actual semiconductor process.

Another embodiment may be a computer readable storage medium stored with computer program code for one or more programs, causing at least one processor to perform a method for minimizing the optical proximity correction (OPC) errors in a semiconductor pattern, as described with reference to FIGS. 3 and 8.

The term "unit," for example, "module" or "table" used in the present embodiment may refer to software components, and hardware components such as a field programmable gate array (FPGA) or an application specific integrated circuit (ASIC), and the module performs certain functions. The module is not meant to be limited to software or hardware components. The module may be configured to reside on an addressable storage medium, and configured to play one or more processors. The module may include components such as software components, object-oriented software components, class components, and task components, and processes, functions, attributes, procedures, subroutines, segments of program code, drivers, firmware, microcode, circuitry, data, databases, data structures, tables, arrays, and variables, as will be appreciated by those skilled in the art. The functions provided in the components and modules may be combined into a smaller number of components and modules, or may be further separated into additional components and modules. In addition, components and modules may be implemented to reproduce one or more CPUs in the device.

According to the method and device for minimizing the optical proximity correction (OPC) errors in a semiconductor pattern, a mask may arbitrarily be modified a plurality of times to extract an optimally adjusted value of a CD error to minimize the OPC errors in the case of an application to an actual semiconductor process, in a simulation process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for minimizing optical proximity correction errors in a semiconductor pattern, the method comprising:
    modifying a mask in a quantized unit into a first intermediate mask to reduce an edge placement error between a simulation layout shape and a target layout shape, the target layout shape being a designed layout pattern, the simulation layout shape being a layout pattern formed by light passing through the mask in a simulation process, and the edge placement error including a critical dimension (CD) error corresponding to a difference between a CD of the simulation layout shape and a CD of the target layout shape at two opposite edges of the simulation layout shape and the target layout shape;
    adjusting the CD error in the edge placement error between the CD of the simulation layout shape and the CD of the target layout shape to generate an adjusted CD error by further modifying at least one side of the first intermediate mask in a predetermined unit according to a comparison result into a second intermediate mask, the comparison result being obtained by comparing an absolute value of the CD error between the CD of the simulation layout shape and the CD of the target layout shape with a predetermined error threshold value; and
    reforming the simulation layout shape by modifying each side of the second intermediate mask with arbitrary correction values into a third intermediate mask.

2. The method according as claimed in claim 1, wherein:
    modifying the mask in the quantized unit, adjusting the CD error between the CD of the simulation layout shape and the CD of the target layout shape, the simulation layout shape being formed by light passing through the mask, and reforming the simulation layout shape are repeated a predetermined number of times to perform a plurality of repeated operations, each repeated operation including adjusting the CD error between the CD of the simulation layout shape and the CD of the target layout shape, and reforming the simulation layout shape, and
    the arbitrary correction values are different by each of the predetermined number of times.

3. The method according as claimed in claim 2, wherein:
    the adjusted CD error is stored by each of the predetermined number of times,
    a minimum CD error is determined as a smallest value among the stored adjusted CD errors, and
    a determined operation is determined among the plurality of repeated operations when the minimum CD error is extracted from the determined operation of the plurality of repeated operations.

4. The method according as claimed in claim 3, further comprising storing at least one of numerical information of the first through third intermediate masks in the determined operation, modification information of the first through third intermediate masks in the determined operation, and the minimum CD error after the plurality of repeated operations are completed the predetermined number of times.

5. The method according as claimed in claim 1, wherein:
the semiconductor pattern is repeatedly formed by using a plurality of layout shapes in each of a plurality of template, and
the method further includes obtaining location information of an averaged simulation layout shape corresponding to each of patterns in a plurality of templates before modifying the mask in the quantized unit.

6. The method according as claimed in claim 5, wherein:
modifying the mask in the quantized unit, adjusting the CD error between the CD of the simulation layout shape and the CD of the target layout shape, and reforming the simulation layout shape are sequentially repeated a predetermined number of times to perform a plurality of repeated operations based on the location information of the averaged simulation layout shape, and
the arbitrary correction values are different by each of the predetermined number of times.

7. The method according as claimed in claim 6, wherein:
the adjusted CD error is stored by each of the predetermined number of times,
a minimum CD error is determined as a smallest value among the stored adjusted CD errors, and
a determined operation is determined among the plurality of repeated operations when the minimum CD error is extracted from the determined operation of the plurality of repeated operations.

8. The method according as claimed in claim 7, further comprising storing at least one of numerical information of the first through third intermediate masks in the determined operation, modification information of the first through third intermediate masks in the determined operation, and the minimum CD error after the plurality of repeated operations are completed the predetermined number of times.

9. The method according as claimed in claim 1, wherein:
when the absolute value of the CD error is greater than the predetermined error threshold value, the at least one side of the first intermediate mask is modified in the predetermined unit to reduce the CD error and to store the reduced CD error, and
when the absolute value of the CD error is smaller than the predetermined error threshold value, the CD error is not further adjusted and is stored.

10. A computer readable storage medium comprising computer program code for one or more programs, wherein the computer program code controls at least one processor to perform the method as claimed in claim 1.

11. A device for minimizing optical proximity correction errors in a semiconductor pattern, the device comprising:
an EPE corrector to modify a mask in a quantized unit to reduce an edge placement error between a simulation layout shape and a target layout shape, the edge placement error including a critical dimension (CD) error corresponding to a difference between a CD of the simulation layout shape and a CD of the target layout shape at two opposite edges of the simulation layout shape and the target layout shape;
a CD corrector to compare an absolute value of the CD error between the CD of the simulation layout shape and the CD of the target layout shape, which is derived by modifying the mask in the EPE corrector, with a predetermined error threshold value to generate a comparison result and to further modify at least one side of the mask in a predetermined unit according to the comparison result to obtain an adjusted CD error; and
a shape disturbancer to modify each side of the mask with arbitrary correction values to reform the simulation layout shape.

12. The device according as claimed in claim 11, wherein the EPE corrector modifies the mask when a multiplication value obtained by multiplying an absolute value of the edge placement error by a predetermined damping value is greater than the quantized unit.

13. The device according as claimed in claim 11, wherein the predetermined unit is a minimum unit by which the mask is movable or modifiable.

14. The device according as claimed in claim 11, wherein:
the semiconductor pattern is repeatedly formed by using a plurality of layout shapes in each of a plurality of templates,
the CD of the simulation layout shape and the CD of the target layout shape include a horizontal axis CD and a vertical axis CD, respectively,
the EPE corrector and the CD corrector perform to reduce the CD error between the CD of the simulation layout shape and the CD of the target layout shape of each of the plurality of layout shapes in each of the plurality of templates.

15. The device according as claimed in claim 11, wherein:
when the absolute value of the CD error is greater than the predetermined error threshold value, the at least one side of the mask is modified in the predetermined unit to store a reduced value of a CD error by the CD corrector, and
when the absolute value of the CD error is smaller than the predetermined error threshold value, the CD error is not further adjusted and is stored.

16. The device according as claimed in claim 11, wherein the shape disturbancer randomly modifies each side of the mask with arbitrary correction values that are different by each of a predetermined number of times.

17. The device according as claimed in claim 16, wherein the EPE corrector further modifies the mask in the quantized unit to reduce the edge placement error between the reformed simulation layout shape and the target layout shape, the reformed simulation layout shape formed by light passing through the mask that is randomly modified with the arbitrary correction values.

18. The device according as claimed in claim 17, wherein:
the shape disturbancer determines a determined operation among a plurality of repeated operations when a minimum CD error is extracted from the determined operation of the plurality of repeated operations, each of the plurality of repeated operations including modifying the mask by the EPE corrector, comparing the absolute value of the CD error with the predetermined error threshold value by the CD corrector, and modifying each side of the mask with the arbitrary correction values by the shape disturbancer, the minimum CD error being determined as a smallest value among adjusted CD errors generated by the CD corrector from the plurality of repeated operations after the predetermined number of times has elapsed, and
the shape disturbancer obtains at least one of numerical information of the mask in the determined operation, modification information of the mask in the determined operation, and the minimum CD error.

19. The device according as claimed in claim 18, wherein the semiconductor pattern is repeatedly formed by using a plurality of layout shapes in each of a plurality of templates, the device further includes a location information averager to derive location information of an averaged simulation layout shape corresponding to each of patterns in a plurality of templates and to provide the location information to the EPE corrector.

20. The device according as claimed in claim 19, wherein:

the determined operation is determined among the plurality of repeated operations based on the location information of the averaged simulation layout shape, and the device stores at least one of numerical information of the mask in the determined operation and numerical information modifying the mask by the EPE corrector in the determined operation.

* * * * *